US005937469A

United States Patent [19]

Culkins et al.

[11] Patent Number: 5,937,469

[45] Date of Patent: Aug. 17, 1999

[54] APPARATUS FOR MECHANICALLY CLEANING THE EDGES OF WAFERS

[75] Inventors: Timothy S. Culkins, Milwaukie; Brent M. Colvin, Hillsboro; Michael R. Carter, Forest Grove, all of Oreg.

[73] Assignee: Intel Corporation, Santa Clara, Calif.

[21] Appl. No.: 08/760,147

[22] Filed: Dec. 3, 1996

[51] Int. Cl.[6] .......... A46B 13/04; B08B 1/04; B08B 11/00

[52] U.S. Cl. .......... 15/77; 15/88.3; 15/179

[58] Field of Search .......... 15/21.1, 77, 88.2, 15/88.3, 88.4, 179, 34, 36, 53.4

[56] References Cited

U.S. PATENT DOCUMENTS

| | | | |
|---|---|---|---|
| 338,157 | 3/1886 | Jones | 15/34 |
| 843,222 | 2/1907 | Luther | 15/77 X |
| 892,129 | 6/1908 | Broderick | 15/88.3 X |
| 1,217,803 | 2/1917 | Mefford | 15/36 |
| 2,394,338 | 2/1946 | Stine | 15/88.3 |
| 2,944,278 | 7/1960 | Bullard | 15/36 X |
| 4,027,686 | 6/1977 | Shortes et al. | 134/33 |
| 4,326,553 | 4/1982 | Hall | 134/153 |
| 5,350,428 | 9/1994 | Leroux et al. | 29/25.01 |
| 5,351,360 | 10/1994 | Suzuki et al. | 15/77 X |

*Primary Examiner*—Mark Spisich
*Attorney, Agent, or Firm*—Blakely, Sokoloff, Taylor & Zafman

[57] ABSTRACT

A method and apparatus for cleaning the edges of substrates. The present invention provides a cleaning mechanism that cleans particles off the edge of the wafer based on friction at a point of contact between the wafer and a wafer edge brush. In one embodiment, the cleaning mechanism includes a side brush that cleans the top-side or bottom-side of a wafer. The side brush is rotated by a motor that is attached to a first end of the side brush. An edge brush is attached to a second end of the side brush and is rotated along with the side brush to clean the edge of the wafer.

21 Claims, 5 Drawing Sheets

202
250
502
222
220
252
501
504
302
503

202
250
502
222
220
380
302
252
501
504
To water or
chemical supply

503

APPARATUS FOR MECHANICALLY CLEANING THE EDGES OF WAFERS

FIELD OF THE INVENTION

The present invention relates to the field of semiconductor wafer processing; more particularly, the present invention relates to cleaning the edges of semiconductor wafers.

BACKGROUND OF THE INVENTION

Semiconductor manufacturers use semiconductor wafers as the base for manufacturing integrated circuits. In one step of the manufacturing process, the wafers are put through chemical mechanical polishing (CMP). CMP is becoming the main planarization technology for both dielectric and metal layers. For the CMP of dielectric layers, such as BPSG, BPTEOS, and PECVD Oxides (often referred to as the ILD0, ILD1, ILD2 . . . layers, respectively), a fumed silica-based slurry is normally used. Other slurries, such as dispersed silica, fumed or dispersed allumina, are also being used for CMP of both oxides and metals (such as tungsten (W) and titanium (Ti)). When the CMP process is completed, the wafers' surfaces are covered in particles, referred to as a slurry residue. At later steps in the process flow, some of this slurry residue is redistributed across the front of the wafer, thereby resulting in a loss in die yield and/or device performance. To prevent the slurry redistribution, all surfaces of a wafer must be free of contamination.

Different post CMP cleaning methods have been introduced in the last few years. These include cleaning the wafers in wet stations using conventional wet cleaning methods, such as SC1, HF and megasonic cleaning. Other cleaning methods in use are based on scrubbing wafers with brushes of various kinds and configurations using DI water or a combination of DI with chemicals such as Ammonia and Citric acid.

One system used to remove wafer contaminants is a double sided scrubber. In a double sided scrubber, a semiconductor wafer is scrubbed simultaneously on both sides by brushes. Since the wafer is being scrubbed simultaneously on both sides by the brushes, there must be a way of holding the wafer in place and rotating the wafer so the entire surface of the wafer is cleaned. A mechanism used for this purpose is commonly referred to as a roller.

Today, double sided scrubbers are usually automated and comprise a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof. FIG. 1 illustrates a conventional double sided wafer scrubber. Referring to FIG. 1, a wafer 102 is being scrubbed by brushes, one of which is shown as brush 110 and the other being beneath wafer 102 and directly below brush 110. Rollers 108 and 109 rotate wafer 102 so the entire wafer surface may be cleaned. Each of brushes 110 is rotated about its central axis by a motor 106. The rotary motion of rollers 108 and 109 is then transferred to wafer 102 when the edge of each of rollers 108 and 109 come into contact with the outer edge of wafer 102.

Although conventional brush cleaning systems can effectively clean the front and backs of semiconductor substrates, such systems fail to provide a sufficient amount of mechanical energy at the edge/bevel area to remove contamination.

The present invention provides a method and apparatus that cleans the edge of substrates, including the bevel area when present.

SUMMARY OF THE INVENTION

A method and apparatus for cleaning edges of substrates is described. The present invention provides a cleaning mechanism that cleans particles off the edge of the wafer based on friction at a point of contact between the wafer and a wafer edge brush. In one embodiment, the cleaning mechanism includes a side brush that cleans the top-side or bottom-side of a wafer. The side brush is rotated by a motor that is attached to a first end of the side brush. An edge brush is attached to a second end of the side brush and is rotated along with the side brush to clean the edge of the wafer.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A method and apparatus for cleaning edges of contaminated substrates is described. The cleaning process may be used in double sided scrubber systems or other systems, such as, for instance, chemical mechanical polishing systems or flat panel display manufacturing systems. In the following description, numerous specific details are set forth such as rotation speeds, chemicals, pressures, etc., in order to provide a thorough understanding of the present invention. It will be apparent, however, to one skilled in the art that the present invention may be practiced without these specific details. In other instances, well-known components, structures and techniques have not been shown in detail in order to avoid obscuring the present invention.

The present invention provides a method and apparatus that cleans the edge of substrates, including the bevel area when present. In the present invention, particles are removed from the edge and/or bevel area (or any other surface sloping from the edge to the top or bottom of the substrate) using an edge scrubbing mechanism that may be incorporated into a scrubber tool. In one embodiment of the present invention, the side scrubbing mechanism comprises a brush added to a double-sided scrubber.

Although the present invention is described in conjunction with the scrubbing of a wafer, it will be appreciated that any similarly shaped, i.e. generally flat, substrate, may be processed by the methods and apparatuses of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOi) devices, two or multiple substrates bonded to each other, or substrates for processing other apparatuses and devices such as flat panel displays, multichip modules, etc.

Figure 2A:
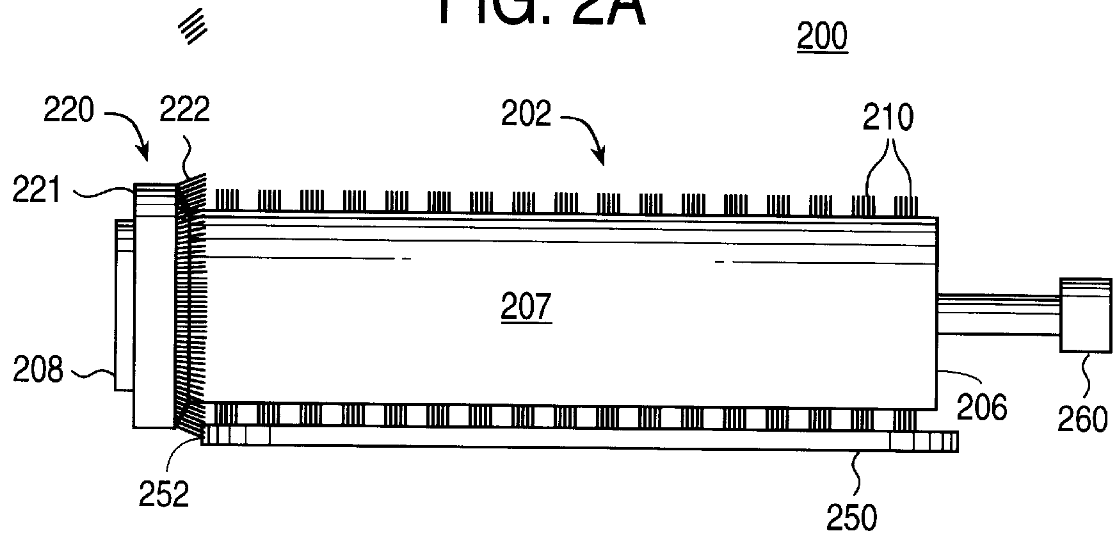
FIG. 2A illustrates a side-sectional view of a single side brush and edge brush cleaning mechanism of one embodiment of the present invention.

FIG. 2A illustrates a simplified side view of a single sided scrubbing mechanism 200 of the present invention. As shown in FIG. 2A, a wafer 250 is shown being cleaned by top-side brush 202 as it moves through a scrubber. Top-side brush 202 includes a: core 206 having an elongated cylindrical portion 207 and a projecting portion 208 disposed at an end of portion 207. Elongated portion 207 contains a plurality of bristles 210 disposed along its outer surface for engaging the top-side of wafer 250. The cleaning mechanism 200 of FIG. 2A also includes an edge brush 220 for cleaning the edge of wafer 250. Edge brush 220 is attached to top-side brush 202 at projecting portion 208 of core 206. Edge brush 220 includes a core 221 having a plurality of bristles 222 extending outwardly from the core to engage the edge/bevel area 252 of wafer 250. A motor 260 is coupled to top-side brush core 206 at an end opposite projecting portion 208 to rotate top-side brush 202 and edge brush 220 about a common axis of rotation to effect cleaning of the top-side surface and edge 252 of wafer 250. The removal of particles from the edge of the wafer is accomplished by sweeping bristles 222 along the edge/bevel area 252 of the wafer in the manner illustrated in FIG. 2A.

Figure 2B:
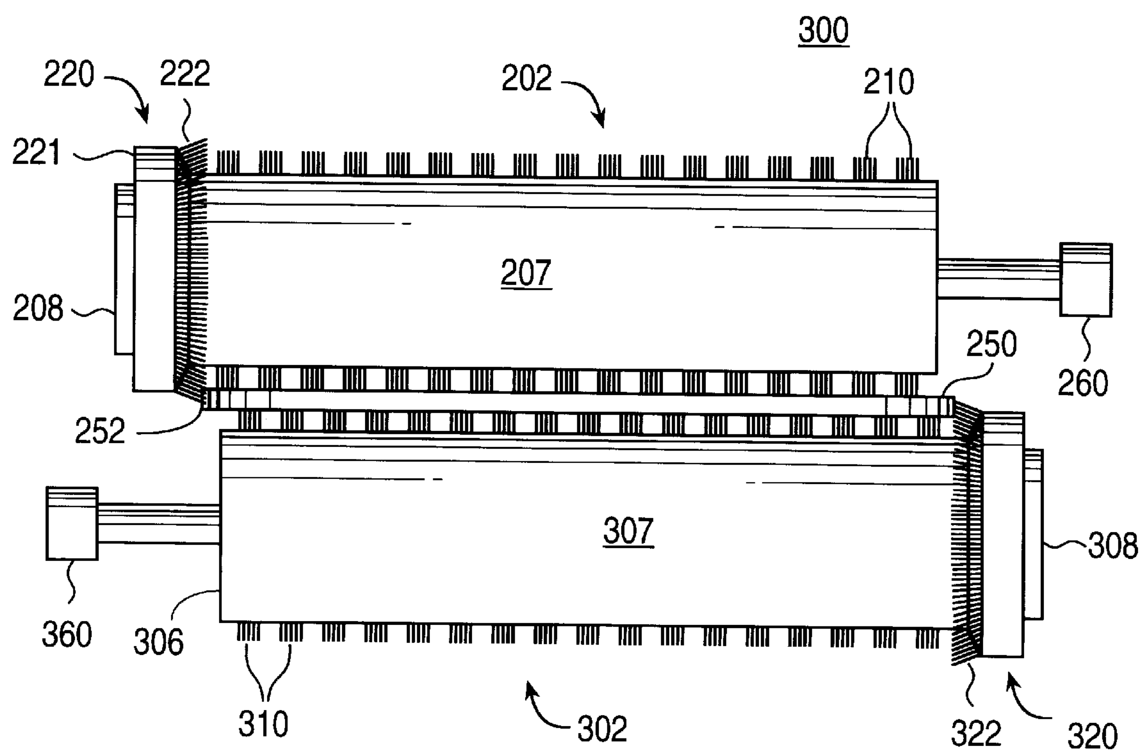
FIG. 2B illustrates a side-sectional view of a double side brush and edge brush cleaning mechanism of one embodiment of the present invention.

FIG. 2B illustrates a double sided scrubber 300 having both a top-side brush 202 and a bottom-side brush 302, wherein each of the side brushes includes an edge brush 220 and 320, respectively, for cleaning the edge/bevel area 252 of wafer 250. Bottom-side brush 302 includes a core 306 having an elongated cylindrical portion 307 and a projecting portion 308 disposed at an end of portion 307. Elongated portion 307 contains a plurality of bristles 310 extending outwardly from its external surface for engaging the bottom-side of wafer 250. Edge brush 320 is attached to bottom-side brush 302 at projecting portion 308. Edge brush 320 is configured similar to edge brush 220 and includes a set of bristles 322 for cleaning the edge/bevel area 252 of wafer 250. As shown in FIG. 2B, top-side brush 202 and bottom-side brush 302 are oriented such that edge brushes 220 and 320 engage the edge/bevel area 252 of wafer 250 along different points. A motor 360 is coupled to core 306 to rotate bottom-side brush 302 and edge brush 320 about a common axis of rotation. Hence, as wafer 250 moves through the double sided scrubber system, side brushes 202 and 302 clean the top and bottom surfaces of wafer 250, while side brushes 220 and 320 remove contaminates along the edge and bevel areas of the wafer.

In one embodiment, edge brush bristles 222 and 322 are made of Poly Vinyl Alcohol (PVA), nylon, polyurethane, or other abrasive materials.

One benefit of the present invention lies in the combined use of side and edge brushes to clean all of the exposed areas of the wafer which may be contaminated with slurry particles. This includes the top surface, bottom surface and the edge/bevel areas of the wafer. Another benefit of the present invention is that edge brushes 220 and 320 may be integrated into current double-side scrubber mechanism with little or no design changes to the scrubber system.

Figure 1:
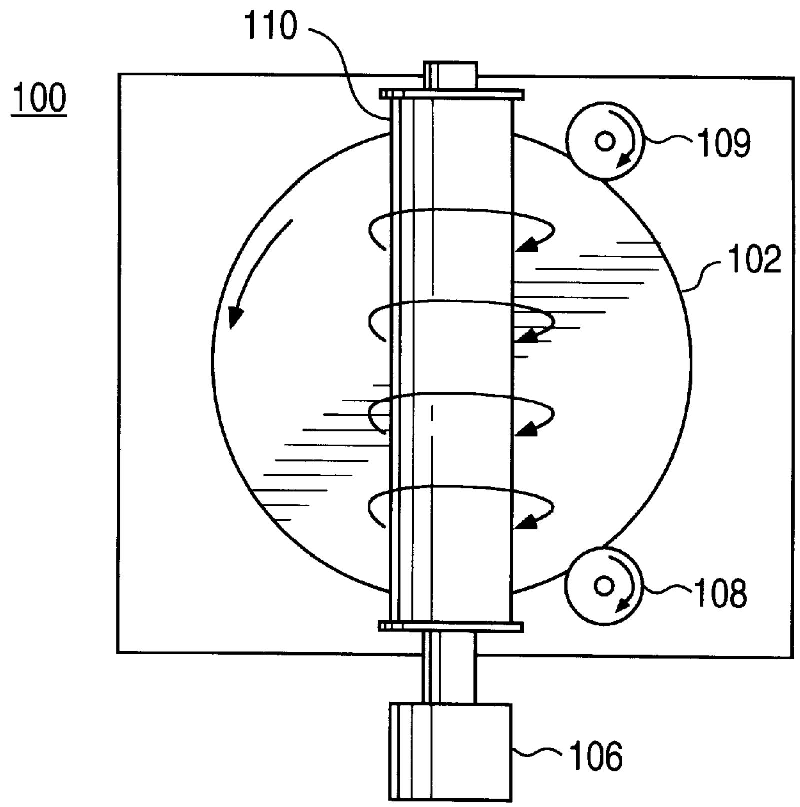
FIG. 1 illustrates a prior art double sided wafer scrubber.
Figure 3A:
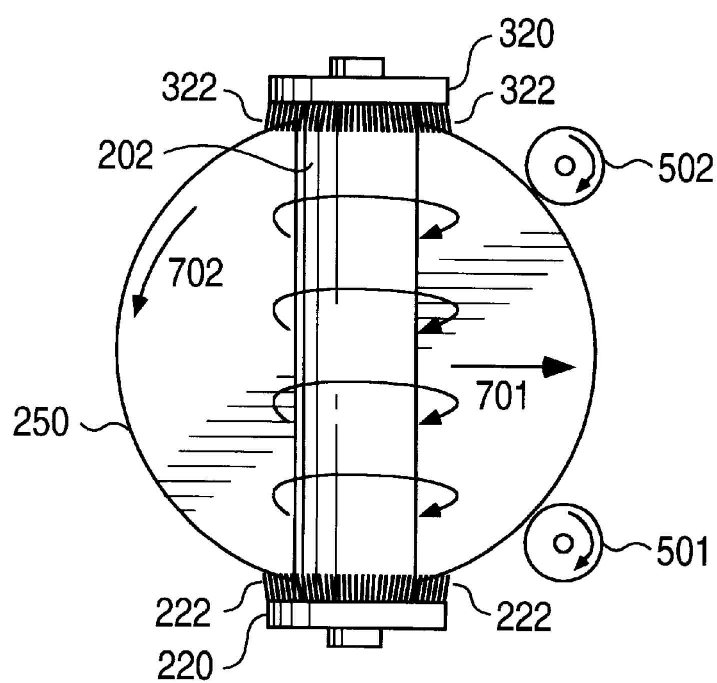
FIG. 3A illustrates a top view of a side brush and edge brush cleaning mechanism of the present invention.
Figure 3B:
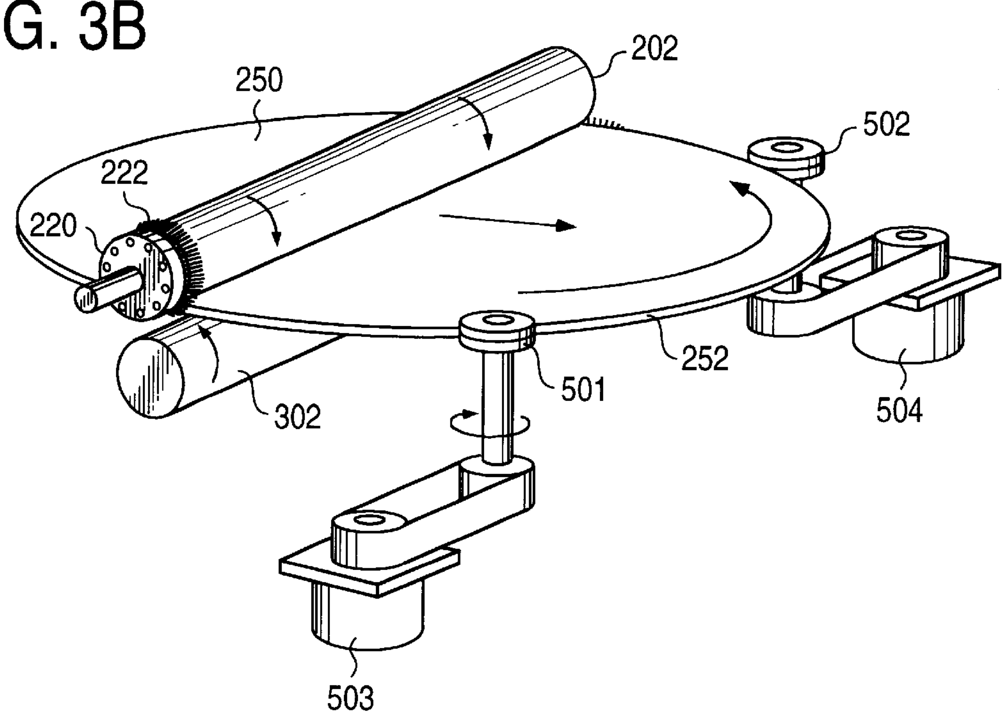
FIG. 3B illustrates a perspective view of a side brush and edge brush cleaning mechanism of the present invention.

Referring to FIGS. 3A and 3B, wafer 250 is shown being cleaned by top-side brush 202 as it moves through the scrubber in the direction indicated by arrow 701. Bottom-side brush 302 is positioned beneath wafer 250 directly below top-side brush 202. Motors 260 and 360 are coupled to each of the top-side and bottom-side brushes, respectively, to provide rotational movement to side brushes 202 and 302 and to edge brushes 220 and 320. Two rollers 501 and 502 contact the wafer at two locations to rotate the wafer in a counter-clockwise direction as indicated by arrow 702. Rotational movement is provided to each of said rollers 501 and 502 by stepper motors 503 and 504, respectively. The rotation of wafer 250 between brushes 202, 302, 220 and 320 allows the entire surface and edge of the wafer to be cleaned.

Figure 3C:
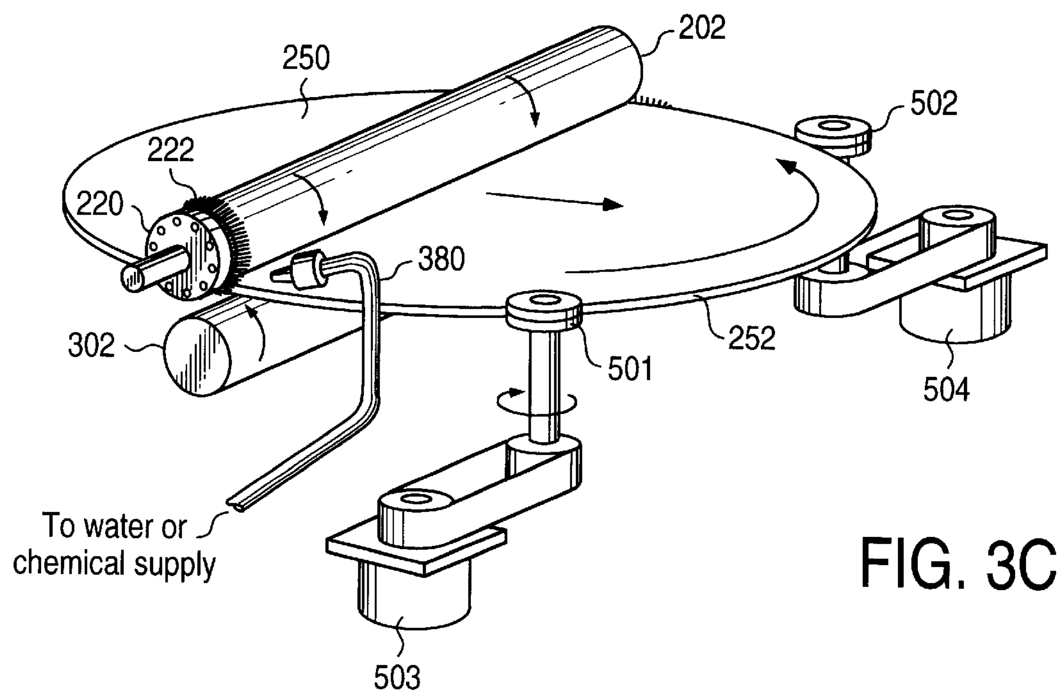
FIG. 3C illustrates a perspective view of a side brush and edge brush cleaning mechanism of the present invention having a jet spray nozzle.

To further facilitate particle removal, water jets 380 may be used to propel water into or near the point of contact between edge brushes 220 and 320 and the wafer, such as shown in FIG. 3C. Such water jets may be positioned such that the direction of water flows from a plane aligned with the rotational axis of the wafer and contact points between the wafer and the side scrubbing mechanism. In such a case, the water may simply carry the particles away that are removed from the wafer by the side scrubbing mechanism or may, if at sufficient pressure, cause removal of particles by itself. Note that the water jets are held in place by support structures which are well-known in the art. In one embodiment, the water jets are held in place above the wafer. Such a jet may be as simple as a barbed coupling with reducing barb to increase the velocity of the created stream. In one embodiment, the barbed coupling is ⅛" to 1/16" in diameter. In another embodiment, the jet may include a nozzle that produces a fanned, knife edge pattern. Water jets are well-known in the art. Note also that jets that spray other chemicals may be used, instead of water, to facilitate particle removal.

The edge brush bristles 222 and 322 may be cleaned occasionally to remove build-up of particles. In one embodiment, the scrubber may flow DI water or a combination of DI water and a chemical such as $NH_4OH$ or $NH_4OH/H_2O_2$ mixture through itself. In an alternate embodiment, the edge brushes may be cleaned by spraying DI or a combination of DI and a chemical such as $NH_4OH$ or $NH_4OH/H_2O_2$ onto bristles 222 and 322 during wafer cleaning to reduce particle build-up.

Figure 4A:
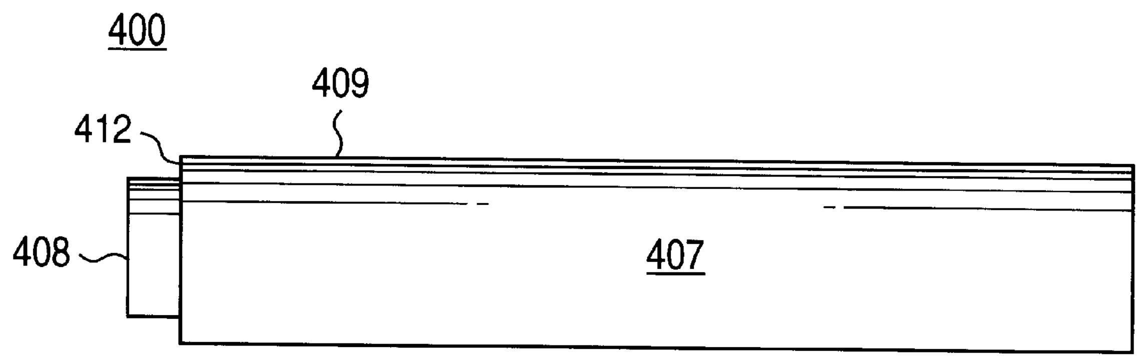
FIG. 4A illustrates a side view of an edge brush core in one embodiment of the present invention.
Figure 4B:
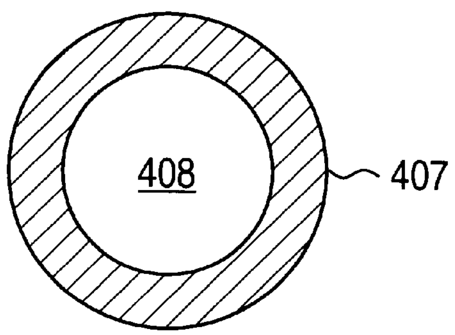
FIG. 4B illustrates an end view of the edge brush core of FIG. 4A in one embodiment of the present invention.
Figure 4C:
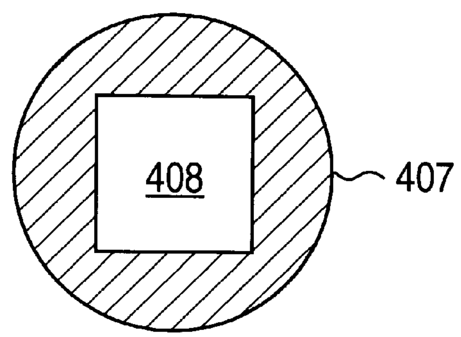
FIG. 4C illustrates an end view of the edge brush core of FIG. 4A in another embodiment of the present invention.

FIG. 4A illustrates a side view of a typical side brush core 400 in one embodiment of the present invention. Core 400 includes an elongated portion 407 being followed by a shoulder 412 that is radially inwardly recessed towards projecting portion 408. In one embodiment, elongated portion 407 and projecting portion 408 have a circular cross-section as depicted in FIG. 4B. It is appreciated, however, that elongated portion 407 and projecting portion 408 may comprise a variety of shapes. For example, in one embodiment, elongated portion 407 may have a cylindrical shape, while projecting portion 408 may have a rectangular shape. (See FIG. 4C.)

Figure 5A:
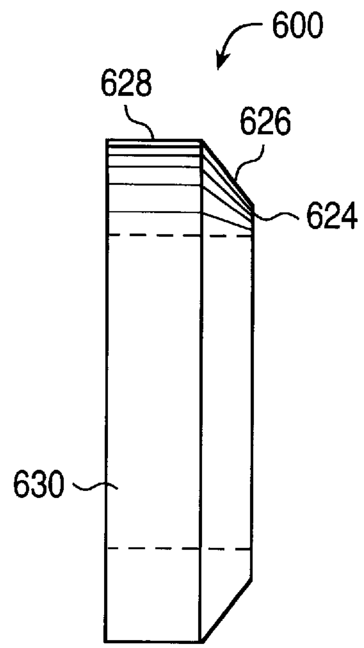
FIG. 5A illustrates a side view of edge brush core in one embodiment of the present invention.
Figure 5B:
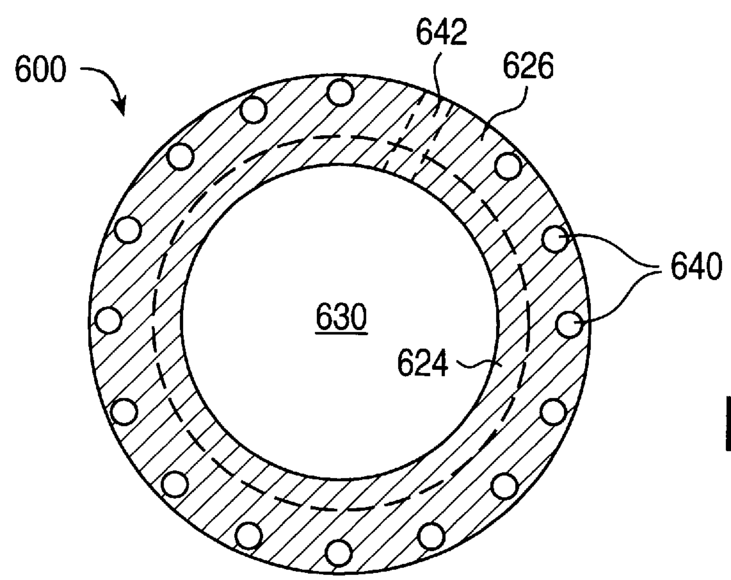
FIG. 5B illustrates a front view of the edge brush core depicted in FIG. 5A.

FIGS. 5A and 5B respectively illustrate a side view and front view of a typical edge brush core configuration that may be used in conjunction with the side brush core 400 of FIGS. 4A and 4B. Core 600 includes a inner bore 630 that is shaped to fit over the projecting portion 408 of side brush core 400. A flat annular face 624 is provided along one side of the core for abutting against the shoulder 412 of side brush core 400 when the edge brush is fully inserted onto projecting portion 408 of core 400. A conical surface 626 flares outwardly from annular face 624 towards an external cylindrical surface 628. Bristle mounting holes 640 are provided along conical surface 626. The bristle mounting holes typically have a circular shape with a center axis that is generally perpendicular to conical face 626. Thus, the slope of conical face 626 generally establishes the angle at which the edge brush bristles contact the edge or bevel area of a wafer. A through hole 642 extending from external cylindrical surface 628 to inner bore 630 is provided to accommodate a set screw (not shown) that attaches the edge brush core 600 to the projecting portion 408 of side brush core 400.

Figure 6:
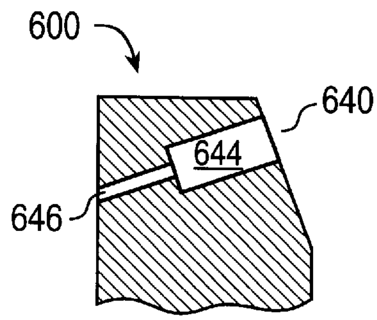
FIG. 6 illustrates a core bristle mount hole in one embodiment of the present invention.

FIG. 6 shows a bristle mounting hole configuration in one embodiment of the present invention. Bristle mounting hole 640 includes a first bore 644 terminating at a second bore 646 of a smaller diameter. This bristle mounting hole arrangement permits the installation of standard bristle inserts into the edge brush core.

Although bristle mounting holes 640 are shown radially aligned around the conical face 626 of core 600, it is appreciated that a staggered hole design may also be used. It is also understood that the angular orientation of the bristle mounting holes in relation to the wafer edge may also vary within a single edge brush core or may vary from one edge brush core to another.

Another important feature of the present invention lies in the ability to readily interchange bristles of varying types into a single edge brush core. As a result, a standard edge brush core design may be used when cleaning any of a variety of contaminates from the edge or bevel area of a wafer. Moreover, it is important to note that bristles of varying textures and stiffness may be used within a single edge brush core to enhance the edge brushes' particle removal capability. As previously discussed, the present invention is also easily integrated into existing post-CMP scrubber technologies and may be designed to fit within existing internal scrubber machine tolerances.

Thus, a method and apparatus for cleaning edges of substrates, such as wafers, is disclosed.

We claim:

1. In a scrubber for scrubbing a side and an edge of a wafer comprising:

a side brush for cleaning said side of said wafer, said side brush having a first core with an end proximate said edge of said wafer;

a first edge brush attached to said end of said first core for cleaning said edge of said wafer, said first edge brush having a second core with an inner bore, said end of said first core secured within said inner bore; and means for rotating said wafer.

2. The scrubber of claim 1 wherein said first core comprises an elongated cylindrical portion being followed by a shoulder radially inwardly recessed towards and connected to a projecting portion at an end of said cylindrical portion, said cylindrical portion having an external surface, said inner bore of said second core shaped to fit over said projecting portion.

3. The scrubber of claim 2 wherein said second core comprises an epoxy material.

4. The scrubber of claim 1 wherein said side brush includes a first plurality of bristles.

5. The scrubber of claim 4 wherein said first edge brush includes a second plurality of bristles.

6. The scrubber of claim 5 wherein said second plurality of bristles includes bristles of varying textures.

7. The scrubber of claim 5 wherein said second plurality of bristles comprise Poly Vinyl Alcohol (PVA).

8. The scrubber of claim 5 wherein said second plurality of bristles comprise nylon.

9. The scrubber of claim 1, wherein the side brush comprises a top-side brush for cleaning a top-side of said wafer, and further comprising:

a bottom-side brush for cleaning a bottom-side of said wafer, said bottom-side brush having a second end proximate said edge of said wafer; and a second edge brush attached to said second end of said bottom-side brush for cleaning said edge of said wafer.

10. The scrubber of claim 1 further comprising a motor coupled to at least one of said first and second cores for rotating said side brush and said first edge brush about a common axis of rotation.

11. The scrubber of claim 1 further comprising means for providing a liquid, near a point of contact between the first edge brush and the wafer.

12. The scrubber of claim 11 wherein the liquid facilitates scrubbing of the edge of the wafer.

13. A scrubber for scrubbing a side and an edge of a wafer, comprising:

a side brush for cleaning said side of said wafer, said side brush having a first core with an end proximate said edge of said wafer, said first core comprising an elongated cylindrical portion followed by a shoulder radially inwardly recessed towards and connected to a projecting portion at an end of said cylindrical portion, said cylindrical portion having an external surface; and an edge brush attached to said end of said first core for cleaning said edge of said wafer, said edge brush having a second core with an inner bore, said end of said first core secured within said inner bore, said second core having a flat annular radial face to abut against said shoulder, wherein said second core includes a conical surface flaring outwardly from said flat annular radial face towards an external cylindrical surface.

14. The scrubber of claim 13 wherein said second core comprises an epoxy material.

15. The scrubber of claim 13 wherein said second core further comprises a through hole extending from said external cylindrical surface to said inner bore, said through hole having internal threads for accommodating a set screw that is used to attach said second core to said first core.

16. The scrubber of claim 13 wherein said side brush includes a first plurality of bristles extending outwardly from said external surface.

17. The scrubber of claim 16 wherein said edge brush includes a second plurality of bristles extending from said conical surface.

18. The scrubber of claim 17 wherein said second plurality of bristles includes bristles of varying textures.

19. The scrubber of claim 17 wherein said second plurality of bristles comprise Poly Vinyl Alcohol (PVA).

20. The scrubber of claim 17 wherein said second plurality of bristles comprise nylon.

21. A scrubber for scrubbing a side and an edge of a wafer comprising:

a side brush for cleaning said side of said wafer, said side brush having a first core with an end proximate said edge of said wafer, said first core comprising an elongated cylindrical portion followed by a shoulder radially inwardly recessed towards and connected to a projecting portion at an end of said cylindrical portion; and an edge brush attached to said end of said first core for cleaning said edge of said wafer, said edge brush having a second core with an inner bore, said end of said first core secured within said inner bore, wherein said second core further comprises a through hole extending from an external surface of second core to said inner bore, said through hole having internal threads for accommodating a set screw that is used to attach said second core to said first core.

* * * * *